(12) United States Patent  (10) Patent No.: US 7,528,580 B2
Sim  (45) Date of Patent: May 5, 2009

(54) APPARATUS AND METHOD FOR MONITORING CHARGING/DISCHARGING CAPACITY OF BATTERY PACKS AS A FUNCTION OF TIME AND TEMPERATURE

(75) Inventor: Se Sub Sim, Youngin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 438 days.

(21) Appl. No.: 11/334,972

(22) Filed: Jan. 18, 2006

(65) Prior Publication Data

US 2006/0164042 A1    Jul. 27, 2006

(30) Foreign Application Priority Data

Jan. 25, 2005    (KR)    .................. 10-2005-0006762

(51) Int. Cl.
*H01M 10/44* (2006.01)
*H01M 10/46* (2006.01)

(52) U.S. Cl. ...................................... 320/150

(58) Field of Classification Search ................ 320/107, 320/114, 132, 149, 150; 324/426, 430, 433
See application file for complete search history.

(56) References Cited

U.S. PATENT DOCUMENTS 5,557,188 A    9/1996    Piercey
5,619,117 A    4/1997    Koenck
5,783,998 A    7/1998    Nakajou et al.

(Continued)

FOREIGN PATENT DOCUMENTS

JP    8-308121    11/1996

(Continued)

OTHER PUBLICATIONS

Patent Abstracts of Japan, Publication No. 11-133122, dated May 21, 1999, in the name of Hiroshi Kato et al.

(Continued)

*Primary Examiner*—Edward Tso
(74) *Attorney, Agent, or Firm*—Christie, Parker & Hale, LLP

(57) ABSTRACT

An apparatus and a method are provided for monitoring a battery pack for accurately calculating an actual discharging or charging capacity of a secondary battery, which depends on temperature. The battery pack monitoring apparatus includes a bare cell adapted to be charged/discharged with a predetermined voltage. Sensors sense the bare cell charging/discharging voltages, charging/discharging currents, and temperature and convert them into predetermined electrical signals. A monitoring control unit converts the electrical signals from the sensors into digital signals and processes them in accordance with predetermined control commands. A storage unit stores tabulated discharging capacity-time data and charging capacity-time data as a function of the bare cell temperature, and outputs this data to the monitoring control unit. The processed data indicating a current charge/discharge capacity of the battery pack is provided to a charger or to another external system.

20 Claims, 4 Drawing Sheets

U.S. PATENT DOCUMENTS

| | | |
|---|---|---|
| 6,198,253 B1 | 3/2001 | Kurle et al. |
| 6,222,348 B1 | 4/2001 | Sato et al. |
| 6,437,540 B2 | 8/2002 | Sonobe |
| 2002/0036481 A1 | 3/2002 | Nagase |
| 2002/0093312 A1 | 7/2002 | Choo |
| 2003/0057918 A1 | 3/2003 | Aoki et al. |

FOREIGN PATENT DOCUMENTS

| | | |
|---|---|---|
| JP | 11-133122 | 5/1999 |
| JP | 2003-051341 | 2/2003 |
| KR | 1995-0034971 | 12/1995 |
| KR | 10-2006-0019766 | 3/2006 |

OTHER PUBLICATIONS

Patent Abstracts of Japan, Publication No. 2003-051341, dated Feb. 21, 2003, in the name of Yuji Tanjo.

European Search Report dated May 4, 2006 for European Application 06100488.3, in the name of Samsung SDI Co., Ltd.

Korean Patent Abstract, Publication No. 1020040068417A, published Jul. 31, 2004, in the name of Dae Hyeon Kim for Korean Patent 10-2006-0019766 listed above.

U.S. Office action dated Mar. 25, 2008, for related U.S. Appl. No. 11/291,113, indicating relevance of listed references in this IDS, except U.S. Patent 5,619,117.

APPARATUS AND METHOD FOR MONITORING CHARGING/DISCHARGING CAPACITY OF BATTERY PACKS AS A FUNCTION OF TIME AND TEMPERATURE

CROSS-REFERENCE TO RELATED APPLICATION

This application claims priority to and the benefit of Korean Patent Application No. 10-2005-0006762, titled APPARATUS AND METHOD FOR MONITORING BATTERY PACK, filed in the Korean Intellectual Property Office on Jan. 25, 2005, the entire content of which is incorporated herein by reference.

BACKGROUND OF THE INVENTION

1. Field of the Invention

The present invention relates to an apparatus and a method for monitoring a battery pack, and more particularly to an apparatus and a method for monitoring a battery pack for accurately calculating an actual discharging or charging capacity of a secondary battery, which depends on temperature, so that the battery pack can be maintained and used in an optimum condition.

2. Description of the Prior Art

Typically, chargeable/dischargeable secondary batteries undergo conversion between chemical energy and electrical energy through electrochemical reactions in which internal active materials oxidize/reduce due to charging/discharging. Performance of the secondary batteries is affected by charging method, discharging depth, temperature during storage and service, load level, number of charging/discharging, and the like. Recent developments of secondary batteries are moving toward lithium ion batteries, lithium polymer batteries, or fuel cells, which have a high energy density and a small mass and are used as industrial, automobile, portable, or mobile power supplies.

Secondary batteries are generally classified into battery cells (also known as bare cells) and battery packs. The bare cells are simply adapted to be charged/discharged without any circuit mounted thereon. The battery packs include a bare cell and various protective and control circuits mounted on the bare cell and are packaged according to the external systems where the battery pack is used.

The circuits mainly control charging/discharging of the secondary batteries and are interrupted, when the secondary batteries are overcharged/over-discharged, to extend the life of the secondary batteries and to protect users from dangerous situations. Recently, monitoring systems are used to more accurately inform external systems of the remaining discharging capacity of battery packs.

However, conventional battery packs or monitoring systems calculate a discharging capacity simply based on a present voltage or current of bare cells and cannot inform external systems of the exact discharging capacity, which depends on temperature.

For example, when a battery pack is fully charged at room temperature and then used at a lower temperature, an external device displays remaining capacity data, which has been calculated based on the lower temperature. A remaining discharging capacity displayed at the lower temperature is smaller than an actual fully charged capacity. However, the remaining capacity data calculated based on the lower temperature is still displayed even when the battery back is again used at room temperature, although the remaining capacity must be updated based on the present temperature. As a result, the exact battery pack capacity conforming to the present temperature is not displayed.

In addition, when a battery pack is fully charged at room temperature and used at the same temperature, an external system displays remaining discharging capacity data, which has been calculated based on the present temperature. However, the remaining capacity data calculated based on room temperature is still displayed even when the battery pack is used at a lower temperature, although the remaining capacity must be updated based on the present temperature (lower temperature). As a result, the exact battery pack capacity conforming to the present temperature is not displayed.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, the present invention provides an apparatus and a method for monitoring a battery pack for accurately calculating an actual discharging or charging capacity of a secondary battery, which depends on temperature, and informing an external system of this capacity so that the battery pack can be maintained and used in an optimum condition.

In one embodiment of the present invention, a battery pack monitoring apparatus is provided that includes a bare cell adapted to be charged/discharged with a predetermined voltage. A voltage sensor senses the bare cell's charging/discharging voltages. A current sensor senses the bare cell's charging/discharging currents. A cell temperature sensor senses the bare cell's temperature. A monitoring control unit converts signals inputted from the voltage sensor, the current sensor, and the cell temperature sensor into digital signals and processes them in accordance with predetermined control commands. A first storage unit tabulates discharging capacity-time data and charging capacity-time data as a function of the bare cell's temperature, stores this data, and outputs them to the monitoring control unit. A second storage unit stores the bare cell's charging/discharging voltages, charging/discharging currents, and temperature processed by the monitoring control unit.

Another embodiment of the invention presents a battery pack monitoring apparatus that includes a bare cell adapted to be charged or discharged with a predetermined voltage. In this apparatus, sensors are provided for sensing bare cell charging/discharging voltages, bare cell charging/discharging currents, and bare cell temperature, and converting sensed bare cell charging/discharging voltages, bare cell charging/discharging currents, and bare cell temperature into predetermined electrical signals. The apparatus also includes first storage unit for storing bare cell discharging capacity versus time data and bare cell charging capacity versus time data as a function of the bare cell temperature. A monitoring control unit in the apparatus converts the predetermined electrical signals into digital signals, receives the tabulated data from the first storage unit, and processes the digital signals and the tabulated data in accordance with predetermined control commands to obtain a present value of the charging/discharging capacity of the battery pack and to obtain processed bare cell charging/discharging voltages, processed bare cell charging/discharging currents, and processed bare cell temperature.

In another embodiment, the apparatus may also include a voltage sensor coupled to the bare cell for sensing the bare cell charging/discharging voltages, a current sensor coupled to the bare cell for sensing the bare cell charging/discharging currents, and a cell temperature sensor for sensing the bare cell temperature. The apparatus may also include a second storage unit coupled to the monitoring control unit for storing the processed voltages, currents, and temperature received from the monitoring control unit. The apparatus may further include external terminals positioned on both ends of the bare cell for coupling the bare cell to an external system, a charging switch and a discharging switch coupled between the bare cell and the external terminals, and a switch temperature sensor coupled to the monitoring control unit for sensing a temperature of the charging switch and a temperature of the discharging switch, converting sensed switch temperatures into switch temperature electrical signals, and sending the switch temperature electrical signals to the monitoring control unit. The second storage unit may also store the sensed switch temperatures.

In another embodiment, a protective circuit unit may be included that is coupled to the charging switch and the discharging switch for receiving input of voltage sensor electrical signals or current sensor electrical signals and toggling on/off the charging switch and the discharging switch in response to the voltage sensor electrical signals or the current sensor electrical signals. A communication interface unit may be included that is coupled to the monitoring control unit to output to the external system the processed bare cell charging/discharging voltages, the processed bare cell charging/discharging currents, the processed bare cell temperature, and the sensed switch temperatures. The monitoring control unit may load discharging capacity-time data from the storage unit based on a present temperature of the bare cell when the bare cell temperature changes, re-calculate a discharging capacity with reference to the bare cell voltage and the bare cell current, and output recalculated discharging capacity to the communication interface unit.

In another embodiment, a battery pack monitoring method is provided that includes tabulating discharging capacity-time data as a function of temperature and storing the data on a storage unit, sensing a bare cell's temperature, loading discharging capacity-time data from the storage unit and calculating a discharging capacity based on the bare cell's present temperature, outputting the calculated discharging capacity to an external system, re-sensing the bare cell's temperature, determining whether or not there is a difference between the sensed temperature of the bare cell and an existing re-sensed temperature of the bare cell, loading discharging capacity-time data corresponding to the re-sensed present temperature from the storage unit, when it has been determined that there is difference in temperature, and re-calculating a discharging capacity based on the bare cell's re-sensed present temperature, and outputting the recalculated discharging capacity to the external system.

In yet another embodiment, a battery pack monitoring method is presented that includes tabulating charging capacity-time data as a function of temperature and storing the data on a storage unit, sensing a bare cell's temperature, loading charging capacity-time data from the storage unit and calculating a charging capacity based on the bare cell's sensed present temperature, outputting the calculated charging capacity to an external system, re-sensing the bare cell's temperature, determining whether or not there is a difference between the first sensed temperature of the bare cell and an existing re-sensed temperature of the bare cell, loading charging capacity-time data corresponding to the presently re-sensed temperature from the storage unit, when it has been determined that there is difference in temperature, and re-calculating a charging capacity based on the bare cell's present and re-sensed temperature, and outputting the recalculated charging capacity to the external system.

An embodiment of the invention includes a battery pack monitoring method for monitoring charging/discharging capacity of a chargeable/dischargeable bare cell included in the battery pack. Bare cell charging/discharging capacity-time data tabulated as a function of bare cell temperature are stored in a storage unit. A bare cell temperature is sensed. A charging/discharging capacity is calculated using the sensed bare cell temperature and the stored tabulated data. The calculated bare cell charging/discharging capacity are provided to an external system. The bare cell temperature is re-sensed. Then it is determined whether there is a difference between the present re-sensed bare cell temperature and the previously sensed bare cell temperature. If a difference is determined, then the bare cell charging/discharging capacity is recalculated using the re-sensed bare cell temperature and the stored tabulated data corresponding to the re-sensed bare cell temperature. The re-calculated bare cell charging/discharging capacity may then be provided to the external system. The method may also include sensing a bare cell charging/discharging voltage, and sensing a bare cell charging/discharging current. The re-calculating of the bare cell charging/discharging capacity may also include re-calculating the charging/discharging capacity using the sensed charging/discharging voltage and the sensed charging/discharging current.

DETAILED DESCRIPTION

Figure 1:
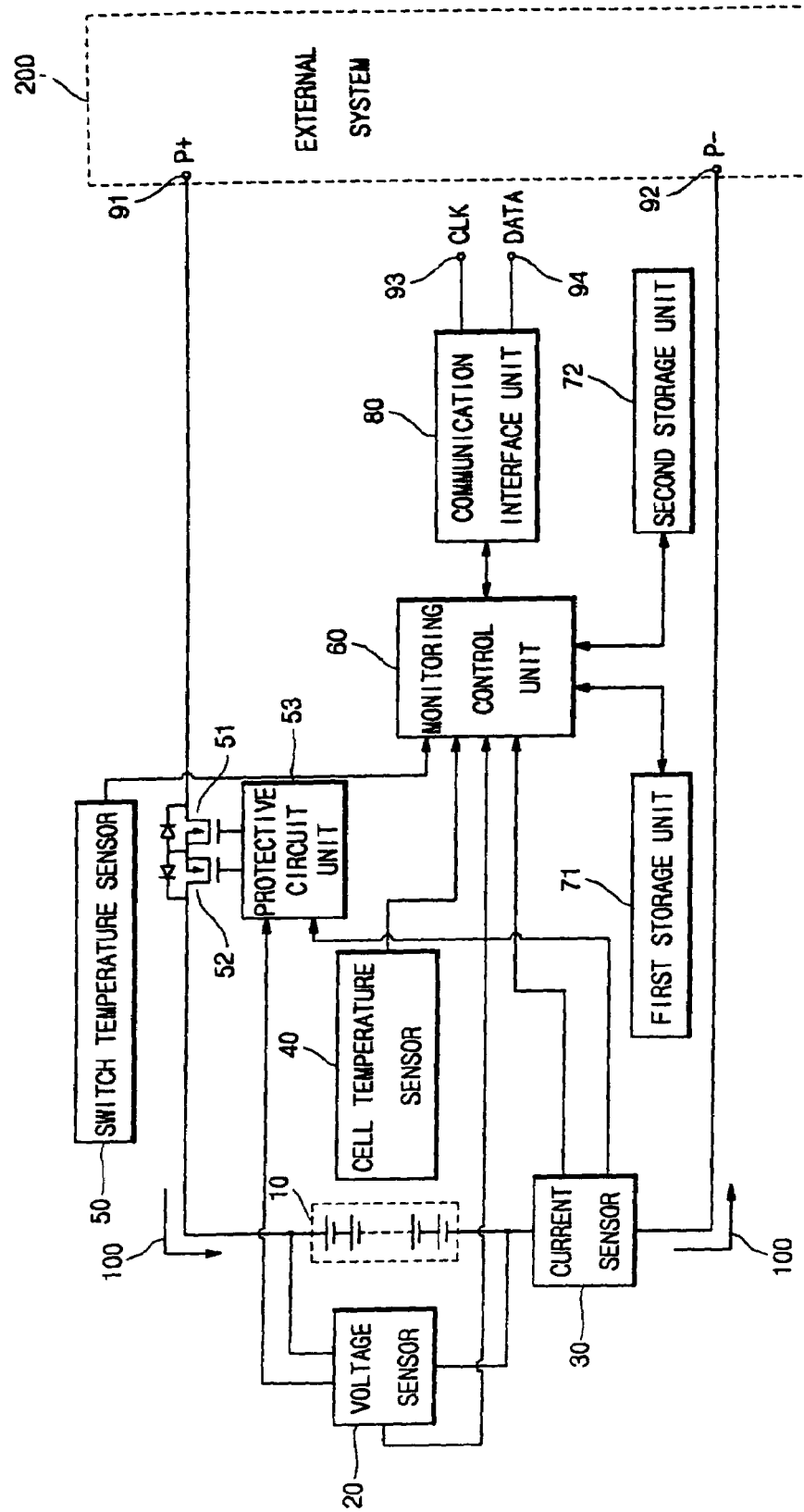
FIG. 1 is a block diagram of a battery pack monitoring apparatus according to the present invention.

As shown in FIG. 1, a battery pack monitoring apparatus according to the present invention may include a bare cell 10, a voltage sensor 20, a current sensor 30, a cell temperature sensor 40, a switch temperature sensor 50, a monitoring control unit 60, a first storage unit 71, a second storage unit 72, and a communication interface unit 80.

At least one bare cell 10 is adapted to be charged or discharged with a predetermined voltage. Two or more bare cells may also be coupled in series and/or in parallel. The bare cell 10 is coupled between external terminals 91 and 92. A charger or an external system 200 is coupled to the external terminals 91 and 92. Therefore, the bare cell 10 is coupled to the charger or the external system 200 in parallel. The bare cell 10 may be any type of secondary battery. For example, the bare cell 10 may be a lithium ion battery, a lithium polymer battery, or a fuel cell. The external system 200 may include, for example, a portable electronic device, an electrical automobile, a hybrid automobile, or their equivalent.

The voltage sensor 20 is coupled to the bare cell 10 in parallel to sense a charging voltage when the bare cell 10 is being charged and a discharging voltage when the bare cell 10 is being discharged. The sensed voltage is converted into a predetermined electrical signal and is outputted to the monitoring control unit 60. The bare cell 10 may be directly coupled to the monitoring control unit 60 in parallel so that the voltage of the bare cell 10 can be sensed by the monitoring control unit 60. The structure or method for sensing the voltage of the bare cell 10 are not limited to those described.

A large-current path 100 extends between the external terminal 91 and the external terminal 92 through charging switch 51 or a discharging switch 52, the bare cell 10 and the current sensor 30. The current sensor 30 is coupled to the large-current path 100 between the bare cell 10 and the external terminal 92 in series to sense a charging current when the bare cell 10 is being charged and a discharging current when the bare cell 10 is being discharged. The sensed current is converted into a predetermined electrical signal and is outputted to the monitoring control unit 60. Particularly, the current sensor 30 has a fixed resistance value and is adapted to sense a voltage applied to it, which depends on the condition of the bare cell 10, to calculate the current flowing through it.

The cell temperature sensor 40 is positioned adjacent to the bare cell 10 to sense a temperature when the bare cell 10 is being charged/discharged. The sensed temperature is converted into a predetermined electrical signal and is outputted to the monitoring control unit 60. The cell temperature sensor 40 may be a thermistor, a winding resistor-type sensor, a wide area resistance sensor, a semiconductor diode sensor, a metal core-type sensor, a thermocouple, or their equivalent, but not limited to these types of sensors. The cell temperature sensor 40 may be positioned outside the battery pack, rather than adjacent to the bare cell 10, when a temperature of the pack itself needs to be sensed.

The switch temperature sensor 50 is positioned in the proximity of the charging and discharging switches 51 and 52, which control charging/discharging in the large-current path 100, to sense surface temperatures of the charging and discharging switches 51 and 52 when the bare cell 10 is being charged/discharged. The sensed surface temperatures are converted into predetermined electrical signals and are outputted to the monitoring control unit 60. The charging and discharging switches 51 and 52 are coupled to the large-current path 100 between the bare cell 10 and the external terminal 91. For example, the charging and discharging switches 51 and 52 may be FETs, the gate voltage of which is controlled by a separate protective circuit unit 53. The protective circuit unit 53 receives input of voltage and current information from the voltage sensor 20 and the current sensor 30 when the bare cell 10 is being charged/discharged. The protective circuit unit 53 toggles off the charging switch 51 during charging when the bare cell 10 is overcharged, and toggles off the discharging switch 52 during discharging when the bare cell 10 is over-discharged.

The monitoring control unit 60 receives input of voltage and current signals of the bare cell 10 from the voltage sensor 20 and the current sensor 30, respectively, and processes them. The monitoring control unit 60 converts signals inputted from the cell temperature sensor 40 and the switch temperature sensor 50 into digital signals and processes them based on a predetermined control order. The monitoring control unit 60 may include a multiplexer to properly distribute signals inputted from the voltage sensor 20, the current sensor 30, the cell temperature sensor 40, and the switch temperature sensor 50, as well as an analog/digital converter to convert analog signals inputted from the sensors into digital signals. The monitoring control unit 60 may further include an oscillator for providing a proper dock frequency, a voltage regulator for providing a stabilized driving voltage, registers for temporarily storing signals inputted from the sensors, and an accumulator for logical operation of data inputted from the sensors. However, components of the monitoring control unit 60 are not limited to those presented and alternatives understood by those skilled in the art may be used to construct an appropriate control circuit.

The first storage unit 71 stores tabulated data on discharging capacity versus time or discharging capacity-time data and charging capacity-time data as a function of temperature of the bare cell, which have been determined through a number of tests. Upon request from the monitoring control unit 60, the first storage unit 71 provides the monitoring control unit 60 with the discharging capacity-time data and charging capacity-time data.

The second storage unit 72 stores data regarding the bare cell 10, which has been processed by the monitoring control unit 60, including charging/discharging voltages, charging/discharging currents, bare cell temperature, and switch temperature. The second storage unit 72 may store highest charging/discharging voltages, highest charging/discharging currents, highest bare cell temperature, and highest switch temperature, which are updated from existing data.

The first and second storage units 71 and 72 may be conventional EEPROMs, flash memories, or their equivalents, but are not limited to these devices.

The communication interface unit 80 is coupled to the monitoring control unit 60 to transmit data of the second storage unit 72 to the external system 200 or transmit a predetermined control signal from the external system 200 to the monitoring control unit 60. The communication interface unit 80 may adopt a conventional RS-232C (Recommended Standard 232 Revision C) mode while including a UART chip for converting parallel data outputted from the monitoring control unit 60 into serial bits, a USB (Universal Serial Bus) mode, an infrared communication mode, or an equivalent of these modes or protocols. However, other modes may also be used. The communication interface unit 80 has a clock terminal 93 and a data terminal 94 for coupling the communication interface unit 80 to the external system 200.

Figure 2A:
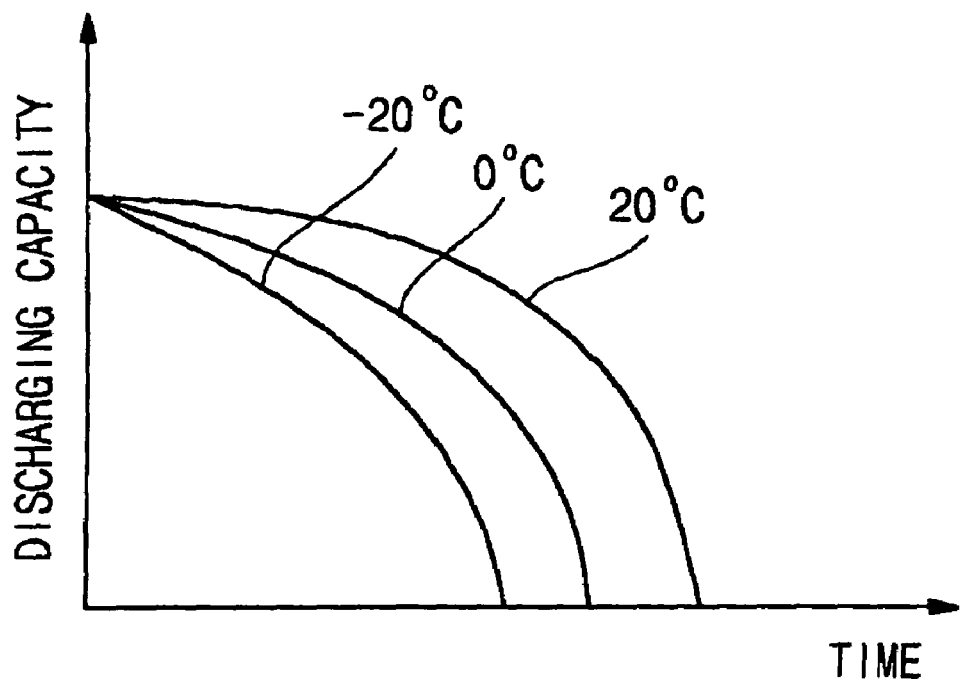
FIG. 2a shows an example of the relationship between discharging capacity, which is stored in a first storage unit of a battery pack monitoring apparatus and time, as a function of temperature, according to the present invention.
Figure 2B:
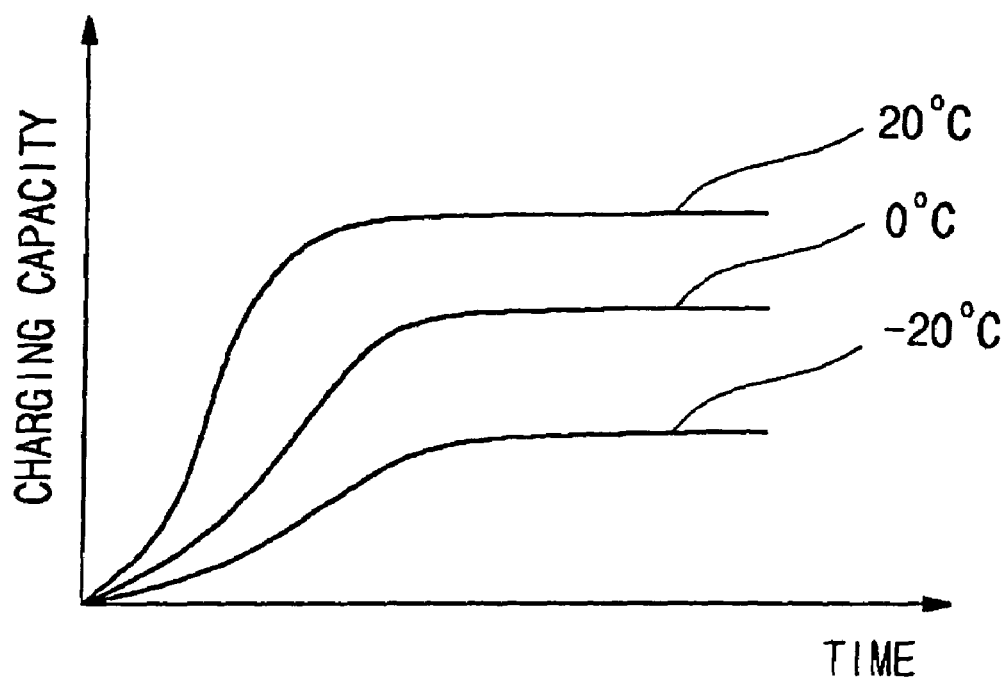
FIG. 2b shows an example of the relationship between charging capacity, which is stored in a first storage unit of a battery pack monitoring apparatus, and time as a function of temperature, according to the present invention.

As shown in FIGS. 2a and 2b, the first storage unit 71 of the battery pack monitoring apparatus according to the present invention stores discharging capacity-time data and charging capacity-time data, which have been experimentally obtained through a number of tests and theoretical calculations, as a function of temperature. For example, as shown in FIG. 2a, discharging capacity tends to increase as temperature rises or decrease as the temperature falls. In addition, as shown in FIG. 2b, charging capacity tends to increase as temperature rises or decrease as the temperature falls.

Figure 3A:
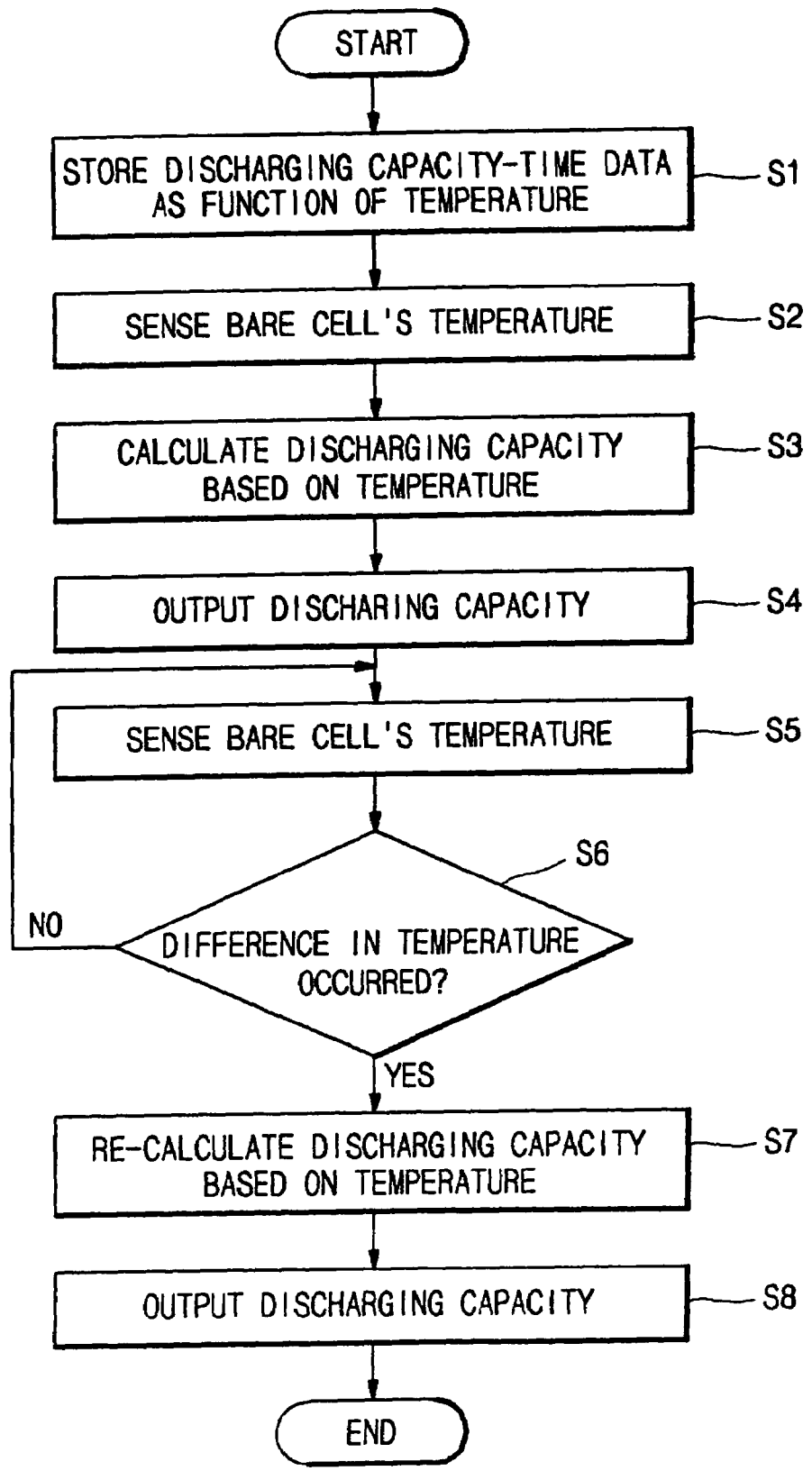
FIG. 3a shows a method for real-time update of discharging capacity of a battery pack according to the present invention.

As shown in FIG. 3a, a method for real-time update of discharging capacity includes tabulating discharging capacity-time data as a function of temperature and storing it in a storage unit (S1); sensing a temperature of a bare cell (S2); loading the discharging capacity-time data stored in the storage unit and calculating a discharging capacity based on the present sensed temperature of the bare cell (S3); outputting the calculated discharging capacity to an external system (S4); re-sensing a temperature of the bare cell (S5); determining whether or not there is any difference between the first sensed temperature of the bare cell and an existing re-sensed temperature thereof (S6); loading discharging capacity-time data corresponding to the present temperature from the storage unit, when it has been determined that there is a difference, and recalculating a discharging capacity based on the present and re-sensed temperature of the bare cell (S7); and providing the recalculated discharging capacity to the external system (S8).

Figure 3B:
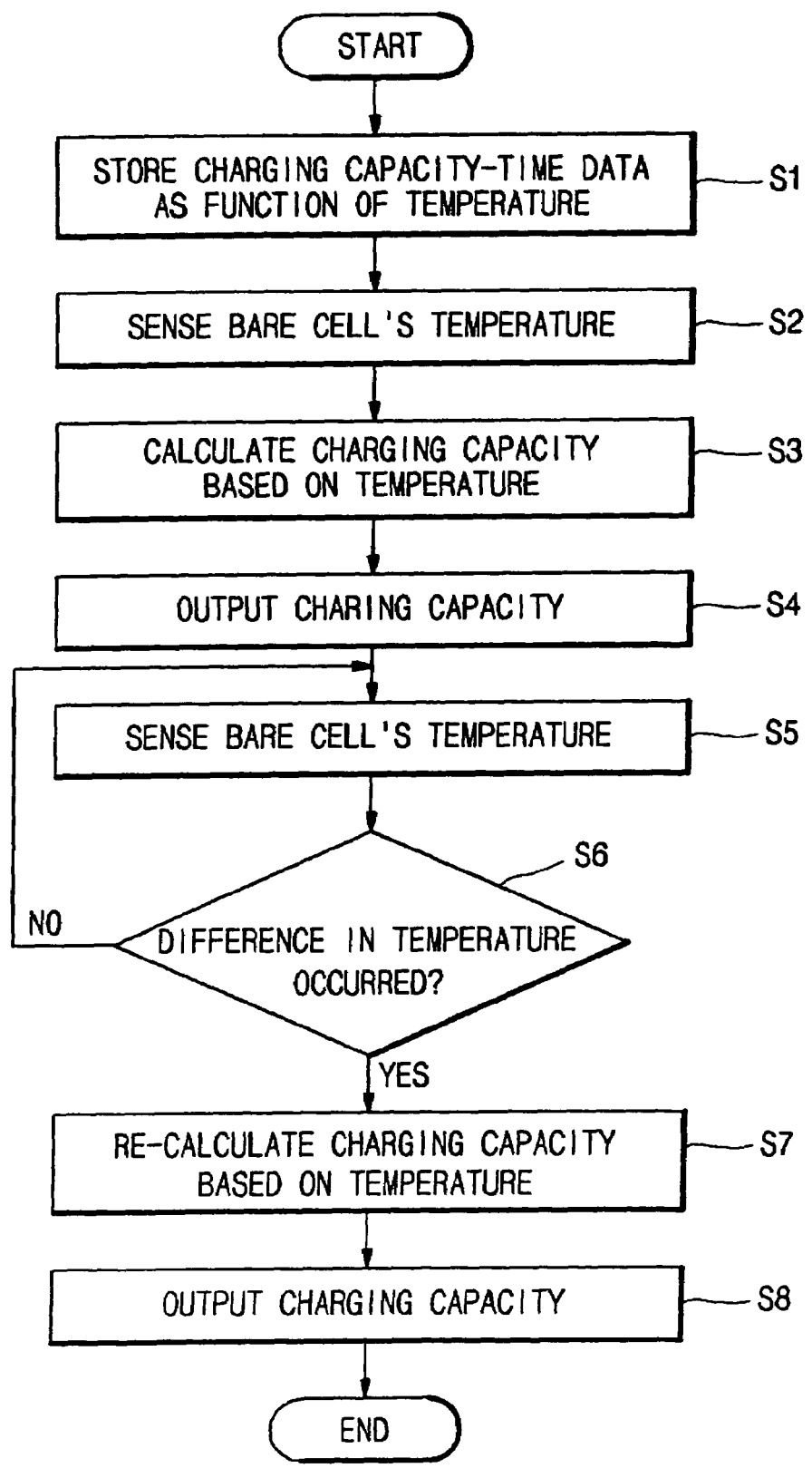
FIG. 3b shows a method for real-time update of charging capacity of a battery pack according to the present invention.

As shown in FIG. 3b, a method for real-time update of charging capacity includes tabulating charging capacity-time data as a function of temperature and storing it on a storage unit (S1); sensing a temperature of a bare cell (S2); loading the charging capacity-time data stored in the storage unit and calculating a charging capacity based on the present and sensed temperature of the bare cell (S3); outputting the calculated charging capacity to an external system (S4); re-sensing a temperature of the bare cell (S5); determining whether or not there is any difference between the sensed temperature of the bare cell and an existing re-sensed temperature thereof (S6); loading charging capacity-time data corresponding to the re-sensed temperature from the storage unit, when it has been determined that there is a difference, and re-calculating a charging capacity based on the existing re-sensed temperature of the bare cell (S7); and outputting the recalculated charging capacity to the external system (S8).

The operation of the apparatus and method for monitoring a battery pack according to the present invention will now be described.

When the Battery Pack is Being Discharged:

According to the present invention, discharging capacity-time data, which has been experimentally obtained through a number of tests and theoretical calculations, is tabulated and stored in the first storage unit 71. For example, discharging capacity included in the data increases as temperature rises or decreases as the temperature falls (S1).

When the battery pack is coupled to the external system 200, a current flows through a positive electrode of the bare cell 10, the charging and discharging switches 51 and 52, the external terminal 91, the external system 200, the external terminal 92, and the current sensor 30 to a negative electrode of the bare cell 10 and the voltage sensor 20. The cell temperature sensor 40 senses a temperature of the bare cell 10. Alternatively, a temperature of the battery pack itself may be sensed, instead of that of the bare cell 10. The voltage sensor 20 senses a discharging voltage of the bare cell 10. The current sensor 30 senses a discharging current of the bare cell 10. The switch temperature sensor 50 senses temperatures of the charging and discharging switches 51 and 52. The temperature, voltage, and current of the bare cell 10, as well as the temperatures of the switches 51, 52 are stored in the second storage unit 72.

Using the temperature sensed by the cell temperature sensor 40, the monitoring control unit 60 loads discharging capacity-time data corresponding to the sensed temperature from the tabulated data stored in the first storage unit 71. With reference to the discharging capacity-time data, the monitoring control unit 60 calculates a present discharging capacity based on the voltage and current obtained from the sensors 20 and 30, respectively (S3). The calculated discharging capacity is stored in the second storage unit 72.

The monitoring control unit 60 outputs information on the present discharging capacity to the external system 200 using the communication interface unit 80 (S4).

The monitoring control unit 60 again senses a temperature of the bare cell 10 or the battery pack itself using the cell temperature sensor 40. The voltage sensor 20 senses a discharging voltage of the bare cell 10, the current sensor 30 senses a discharging current of the bare cell 10, and the switch temperature sensor 50 senses temperatures of the charging and discharging switches 51 and 52. The temperature, voltage, and current of the bare cell 10, as well as the temperatures of the switches 51, 52 are stored in the second storage unit 72.

The monitoring control unit 60 determines whether or not there is any change in temperature of the bare cell 10, based on values obtained from the cell temperature sensor 40 (S6). If there is no difference between the present and previous sensed temperatures, then a voltage and a current of the bare cell 10, as well as temperatures of the charging and discharging switches 51, 52 are sensed again as shown by the return loop from (S6) in FIG. 3a.

For example, when the battery pack is fully charged at room temperature and then used at a lower temperature, the monitoring control unit 60 determines that there is temperature change. When the battery pack is fully charged at a low temperature and then used at a higher temperature (room temperature), the monitoring control unit 60 also determines that there is temperature change. When the monitoring control unit 60 determines that that there is no temperature change, the temperature of the bare cell 10 or the battery pack itself is repeatedly sensed using the cell temperature sensor 40.

When the monitoring control unit 60 determines that there is a change in temperature, it refers to the temperature of the bare cell 10 obtained from the cell temperature sensor 40 and loads discharging capacity-time data corresponding to that temperature from the first storage unit 71. With reference to the discharging capacity-time data, the monitoring control unit 60 re-calculates a present discharging capacity based on the voltage and current obtained from the sensor (S7). The re-calculated discharging capacity is stored in the second storage unit 72.

The monitoring control unit 60 outputs information on the modified discharging capacity to the external system 200 using the communication interface unit 80. This completes a cycle of the monitoring method of the discharging capacity versus time according to the present invention (S8). Storing discharging capacity-time data as a function of temperature (S1) is omitted in the next cycle, because storage of discharging capacity-time data is needed only one time before the battery pack is shipped.

When the Battery Pack is Being Charged:

According to the present invention, charging capacity-time data, which has been experimentally obtained through a number of tests and theoretical calculations, is tabulated and stored in the first storage unit 71 (S1). The increases or decreases of charging capacity as the temperature rises or falls is also reflected in the capacity versus time data that is stored in the first storage unit 71 (FIG. 2b).

When the battery pack is coupled to a charger, a current flows through the external terminal 91, the charging and discharging switches 51 and 52, the bare cell 10, the voltage sensor 20, the current sensor 30, and the external terminal 92. The cell temperature sensor 40 senses a temperature of the bare cell 10. Alternatively, a temperature of the battery pack itself may be sensed instead of the temperature of the bare cell 10. The voltage sensor 20 senses a charging voltage of the bare cell 10. The current sensor 30 senses a charging current of the bare cell 10. The switch temperature sensor 50 senses temperatures of the charging and discharging switches 51 and 52 (S2). The temperature, voltage, and current of the bare cell 10, as well as the temperatures of the switches 51, 52 are stored in the second storage unit 72.

With reference to the temperature sensed by the cell temperature sensor 40, the monitoring control unit 60 loads charging capacity-time data corresponding to that temperature from the first storage unit 71. With reference to the charging capacity-time data, the monitoring control unit 60 calculates a present charging capacity based on the voltage and current obtained from the sensors 20 and 30, respectively (S3). The calculated charging capacity is stored in the second storage unit 72.

The monitoring control unit 60 outputs information on the present charging capacity to the external system 200 using the communication interface unit 80 (S4).

The monitoring control unit 60 again senses a temperature of the bare cell 10 or the battery pack itself using the cell temperature sensor 40. The voltage sensor 20 senses a charging voltage of the bare cell 10, the current sensor 30 senses a charging current of the bare cell 10, and the switch sensor 50 senses temperatures of the charging and discharging switches 51 and 52. The temperature, voltage, and current of the bare cell, as well as the temperatures of the switches are stored in the second storage unit 72.

The monitoring control unit 60 determines whether or not there is any change in temperature of the bare cell 10, based on values obtained from the cell temperature sensor 40 (S6). At the same time, a voltage and a current of the bare cell 10, as well as temperatures of the charging and discharging switches are sensed.

For example, when the battery pack is fully charged at room temperature and then used at a lower temperature, the monitoring control unit 60 determines that there is temperature change. When the battery pack is fully charged at a low temperature and then used at a higher temperature (room temperature), in contrast, the monitoring control unit 60 also determines that there is temperature change. When the monitoring control unit 60 determines that that there is no temperature change, the temperature of the bare cell 10 or the battery pack itself is repeatedly sensed using the cell temperature sensor 40.

When the monitoring control unit 60 determines that there is temperature change, it refers to the temperature of the bare cell 10 obtained from the cell temperature sensor 40 and loads charging capacity-time data corresponding to that temperature from the first storage unit 71. With reference to the charging capacity-time data, the monitoring control unit 60 re-calculates a present charging capacity based on the voltage and current obtained from the sensor (S7). The re-calculated charging capacity is stored in the second storage unit 72.

The monitoring control unit 60 outputs information on the modified charging capacity to the external system 200 using the communication interface unit 80. This completes a first cycle of the monitoring method according to the present invention (S8). The storing of charging capacity-time data as a function of temperature (S1) is omitted in the next cycle, because storage of charging capacity-time is needed only one time before the battery pack is shipped.

As mentioned above, the apparatus and method for monitoring a battery pack according to the present invention have the features that, when the battery pack's temperature changes, the battery pack's charging or discharging capacity is re-calculated based on the change and is transmitted to an external system, so that the external system can always maintain and use the battery pack in an optimum condition.

In addition, information on the battery pack's present voltage, current, and temperature is transmitted to the external system in real-time so that, when the battery pack malfunctions, the exact cause can be determined more easily and the battery pack can be diagnosed more accurately.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A battery pack monitoring apparatus comprising:
   a bare cell adapted to be charged or discharged with a bare cell voltage;
   sensors for sensing bare cell charging/discharging voltages, bare cell charging/discharging currents, and bare cell temperature, and converting sensed bare cell charging/discharging voltages, bare cell charging/discharging currents, and bare cell temperature into electrical signals;
   a first storage unit for storing bare cell discharging capacity versus time data and bare cell charging capacity versus time data as a function of the bare cell temperature to obtain tabulated data; and
   a monitoring control unit for converting the electrical signals into digital signals, for receiving the tabulated data from the first storage unit, and for processing the digital signals and the tabulated data in accordance with control commands to obtain a present value of the charging/discharging capacity of the battery pack as a function of time and temperature and to obtain processed bare cell charging/discharging voltages, processed bare cell charging/discharging currents, and processed bare cell temperature.

2. The battery pack monitoring apparatus as claimed in claim 1, wherein the sensors include:
   a voltage sensor coupled to the bare cell for sensing the bare cell charging/discharging voltages;
   a current sensor coupled to the bare cell for sensing the bare cell charging/discharging currents; and
   a cell temperature sensor for sensing the bare cell temperature.

3. The battery pack monitoring apparatus as claimed in claim 2, further comprising a second storage unit coupled to the monitoring control unit for storing the processed bare cell charging/discharging voltages, the processed bare cell charging/discharging currents, and the processed bare cell temperature received from the monitoring control unit.

4. The battery pack monitoring apparatus as claimed in claim 3, further comprising:
   external terminals positioned on both ends of the bare cell for coupling the bare cell to an external system;
   a charging switch and a discharging switch coupled between the bare cell and the external terminals; and
   a switch temperature sensor coupled to the monitoring control unit for sensing a temperature of the charging switch and a temperature of the discharging switch, converting sensed switch temperatures into switch temperature electrical signals, and sending the switch temperature electrical signals to the monitoring control unit.

5. The battery pack monitoring apparatus as claimed in claim 4, wherein the second storage unit is adapted to store the sensed switch temperatures.

6. The battery pack monitoring apparatus as claimed in claim 4, further comprising a protective circuit unit coupled to the charging switch and the discharging switch for receiving input of voltage sensor electrical signals or current sensor electrical signals and toggling on/off the charging switch and the discharging switch in response to the voltage sensor electrical signals or the current sensor electrical signals.

7. The battery pack monitoring apparatus as claimed in claim 6, further comprising a communication interface unit coupled to the monitoring control unit to output to the external system the processed bare cell charging/discharging voltages, the processed bare cell charging/discharging currents, the processed bare cell temperature, and the sensed switch temperatures.

8. The battery pack monitoring apparatus as claimed in claim 7, wherein the communication interface unit uses a protocol selected from an RS-232C (Recommended Standard 232 Revision C) mode, a USB (Universal Serial Bus) mode, and an infrared communication mode.

9. The battery pack monitoring apparatus as claimed in claim 2, wherein the cell temperature sensor is selected from a thermistor, a winding resistor-type sensor, a wide area resistance sensor, a semiconductor diode sensor, a metal core-type sensor, and a thermocouple.

10. The battery pack monitoring apparatus as claimed in claim 4, wherein the switch temperature sensor is selected from a thermistor, a winding resistor-type sensor, a wide area resistance sensor, a semiconductor diode sensor, a metal core-type sensor, and a thermocouple.

11. The battery pack monitoring apparatus as claimed in claim 7, wherein the monitoring control unit is adapted to:
    load discharging capacity-time data from the storage unit based on a present temperature of the bare cell when the bare cell temperature changes;
    re-calculate a discharging capacity as a function of time and temperature with reference to the bare cell voltage and the bare cell current; and
    output re-calculated discharging capacity to the communication interface unit.

12. The battery pack monitoring apparatus as claimed in claim 7, wherein the monitoring control unit is adapted to:
    load charging capacity-time data from the storage unit based on a present temperature of the bare cell when the bare cell temperature changes;
    re-calculate a charging capacity with reference to the bare cell voltage and the bare cell current; and
    output re-calculated charging capacity to the communication interface unit.

13. The battery pack monitoring apparatus as claimed in claim 4, wherein the external system is chosen from a charger, a portable electronic device, an electrical automobile, and a hybrid automobile.

14. A battery pack monitoring apparatus for monitoring charging/discharging capacity of a chargeable/dischargeable bare cell included in the battery pack, the apparatus comprising:
    a monitoring control unit for receiving and processing a sensed bare cell voltage, a sensed bare cell current, and a sensed bare cell temperature from the chargeable/dischargeable bare cell; and
    a storage unit coupled to the monitoring control unit for storing tabulated bare cell discharging capacity-time data and bare cell charging capacity-time data as a function of bare cell temperature to obtain stored tabulated data and for outputting the stored tabulated data to the monitoring control unit,
    wherein the monitoring control unit calculates a present charging/discharging capacity of the chargeable/dischargeable bare cell as a function of time and temperature using the stored tabulated data and the sensed bare cell voltage, the sensed bare cell current, and the sensed bare cell temperature.

15. A battery pack monitoring method for monitoring discharging capacity of a chargeable/dischargeable bare cell included in the battery pack, the method comprising:
    storing bare cell discharging capacity-time data tabulated as a function of bare cell temperature in a storage unit to obtain stored tabulated date;
    sensing a bare cell temperature to obtain a sensed bare cell temperature;
    calculating a discharging capacity using the sensed bare cell temperature and the stored tabulated data to obtain a calculated bare cell discharging capacity as a function of time and temperature;
    providing the calculated bare cell discharging capacity to an external system;
    re-sensing the bare cell temperature to obtain a re-sensed bare cell temperature;
    determining whether there is a difference between the re-sensed bare cell temperature and the sensed bare cell temperature;
    re-calculating a bare cell discharging capacity using the re-sensed bare cell temperature and the stored tabulated data corresponding to the re-sensed bare cell temperature when a difference is determined and to obtain a re-calculated bare cell discharging capacity; and
    providing the re-calculated bare cell discharging capacity to the external system.

16. The battery pack monitoring method as claimed in claim 15, further comprising:
    sensing a bare cell discharging voltage to obtain a sensed discharging voltage; and
    sensing a bare cell discharging current to obtain a sensed discharging current.

17. The battery pack monitoring method as claimed in claim 16, wherein the re-calculating of the bare cell discharging capacity using the re-sensed bare cell temperature and the stored tabulated data corresponding to the re-sensed bare cell temperature further includes re-calculating the discharging capacity using the sensed discharging voltage and the sensed discharging current.

18. A battery pack monitoring method for monitoring charging capacity of a chargeable/dischargeable bare cell included in the battery pack, the method comprising:
    storing bare cell charging capacity-time data tabulated as a function of bare cell temperature in a storage unit to obtain stored tabulated date;
    sensing a bare cell temperature to obtain a sensed bare cell temperature;
    calculating a charging capacity using the sensed bare cell temperature and the stored tabulated data to obtain a calculated bare cell charging capacity as a function of time and temperature;
    providing the calculated bare cell charging capacity to an external system;
    re-sensing the bare cell temperature to obtain a re-sensed bare cell temperature;
    determining whether there is a difference between the re-sensed bare cell temperature and the sensed bare cell temperature;
    re-calculating a bare cell charging capacity using the re-sensed bare cell temperature and the stored tabulated data corresponding to the re-sensed bare cell temperature when a difference is determined and to obtain a re-calculated bare cell charging capacity; and
    providing the recalculated bare cell charging capacity to the external system.

19. The battery pack monitoring method as claimed in claim 18, further comprising:
    sensing a bare cell charging voltage to obtain a sensed charging voltage; and
    sensing a bare cell charging current to obtain a sensed charging current.

20. The battery pack monitoring method as claimed in claim 19, wherein the re-calculating of the bare cell charging capacity using the re-sensed bare cell temperature and the stored tabulated data corresponding to the re-sensed bare cell temperature further includes re-calculating the charging capacity using the sensed charging voltage and the sensed charging current.

* * * * *

UNITED STATES PATENT AND TRADEMARK OFFICE
CERTIFICATE OF CORRECTION

PATENT NO. : 7,528,580 B2
APPLICATION NO. : 11/334972
DATED : May 5, 2009
INVENTOR(S) : Se Sub Sim

It is certified that error appears in the above-identified patent and that said Letters Patent is hereby corrected as shown below:

Column 11, Claim 11, line 21    After "load" Insert -- the bare cell --
                                After "capacity" Delete "-" and Insert -- versus --
                                After "the" Insert -- first --

Column 11, Claim 12, line 31    After "load" Insert -- the bare cell --
                                After "capacity" Delete "-" and Insert -- versus --
                                After "the" Insert -- first --

Column 12, Claim 18, line 58    Delete "recalculated" Insert -- re-calculated --

Signed and Sealed this
Eighth Day of February, 2011

David J. Kappos
*Director of the United States Patent and Trademark Office*